(12) United States Patent
Chan

(10) Patent No.: US 6,670,259 B1
(45) Date of Patent: Dec. 30, 2003

(54) INERT ATOM IMPLANTATION METHOD FOR SOI GETTERING

(75) Inventor: Simon Siu-Sing Chan, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 33 days.

(21) Appl. No.: 10/068,396

(22) Filed: Feb. 5, 2002

Related U.S. Application Data
(60) Provisional application No. 60/270,424, filed on Feb. 21, 2001.

(51) Int. Cl.⁷ .................... H01L 21/322; H01L 21/00; H01L 21/76; H01L 21/8222; H01L 21/335
(52) U.S. Cl. .................... 438/473; 438/58; 438/143; 438/310; 438/402; 438/477
(58) Field of Search .................. 438/471, 473, 438/58, 143, 474, 476, 477, 310, 402

(56) References Cited

U.S. PATENT DOCUMENTS

| | | | |
|---|---|---|---|
| 3,936,858 A | | 2/1976 | Seeds et al. |
| 4,498,227 A | | 2/1985 | Howell et al. |
| 5,194,395 A | | 3/1993 | Wada |
| 5,244,819 A | * | 9/1993 | Yue .................. 438/402 |
| 5,272,104 A | | 12/1993 | Schrantz et al. |
| 5,443,661 A | | 8/1995 | Ogura et al. |
| 5,453,153 A | | 9/1995 | Fan et al. |
| 5,501,993 A | | 3/1996 | Borland |
| 5,646,053 A | | 7/1997 | Schepis et al. |
| 5,753,560 A | * | 5/1998 | Hong et al. .................. 438/402 |
| 5,773,152 A | | 6/1998 | Okonogi |
| 5,786,231 A | * | 7/1998 | Warren et al. ................ 438/17 |
| 5,795,809 A | | 8/1998 | Gardner et al. |
| 5,807,771 A | | 9/1998 | Vu et al. |
| 5,818,085 A | | 10/1998 | Hsu et al. |
| 5,882,990 A | | 3/1999 | DeBusk et al. |
| 5,899,732 A | | 5/1999 | Gardner et al. |
| 5,926,727 A | | 7/1999 | Stevens et al. |
| 5,929,508 A | | 7/1999 | Delgado et al. |

(List continued on next page.)

FOREIGN PATENT DOCUMENTS

JP      402211616 A   *   8/1990

OTHER PUBLICATIONS

"Basic Gettering Principles" (Crystalline Defects, Thermal Processing, and Gettering), *Silicon Processing For The VLSI Era*, Wolf and Tauber, vol. 1: Process Technology, pp. 63–70 (1986).

(List continued on next page.)

*Primary Examiner*—Matthew Smith
*Assistant Examiner*—Chuong Luu
(74) *Attorney, Agent, or Firm*—Renner, Otto, Boisselle & Sklar, LLP

(57) ABSTRACT

The present invention relates to a method of manufacturing a silicon-on-insulator substrate, comprising the steps of (1) providing a silicon-on-insulator semiconductor wafer having at least one surface of a silicon film; (2) implanting an inert atom into the at least one surface to form a damaged surface layer including a gettering site on the silicon film and to leave an undamaged region of the silicon film; (3) subjecting the wafer to conditions to getter at least one impurity from the silicon film into the gettering site; and (4) removing the damaged surface layer.

20 Claims, 2 Drawing Sheets

U.S. PATENT DOCUMENTS

| | | | |
|---|---|---|---|
| 5,965,917 A | | 10/1999 | Maszara et al. |
| 5,976,956 A | | 11/1999 | Gardner et al. |
| 6,001,711 A | | 12/1999 | Hashimoto |
| 6,010,950 A | | 1/2000 | Okumura et al. |
| 6,013,584 A | | 1/2000 | M'Saad |
| 6,022,793 A | * | 2/2000 | Wijaranakula et al. ..... 438/473 |
| 6,024,888 A | | 2/2000 | Watanabe et al. |
| 6,083,324 A | | 7/2000 | Henley et al. |
| 6,093,624 A | | 7/2000 | Letavic et al. |
| 6,100,202 A | | 8/2000 | Lin et al. |
| 6,114,223 A | | 9/2000 | Gonzalez et al. |
| 6,133,123 A | | 10/2000 | Gonzalez |
| 6,255,195 B1 | * | 7/2001 | Linn et al. ................. 438/455 |
| 6,284,629 B1 | * | 9/2001 | Yokokawa et al. ......... 438/459 |
| 6,444,534 B1 | * | 9/2002 | Maszara .................... 438/311 |
| 6,534,380 B1 | * | 3/2003 | Yamauchi et al. .......... 438/455 |
| 6,548,382 B1 | * | 4/2003 | Henley et al. .............. 438/526 |
| 6,569,749 B1 | * | 5/2003 | Wijaranakula et al. ..... 438/471 |

OTHER PUBLICATIONS

Improved SI–EPI–Wafers by Buried Damage Layer for Extrinsic Gettering; Dziesiatv and Wencel; Humboldt Univ. Of Berlin Section of Physics, unknown date.

Gettering Technique and Structure, IBM Technical Disclosure Bulletin 5/75.

"Nanoscale CMOS", *Proceedings of the IEEE*, Wong, et al., vol. 87, No. 4, Apr. 1999.

* cited by examiner

INERT ATOM IMPLANTATION METHOD FOR SOI GETTERING

RELATED APPLICATIONS

This application claims the benefit of and priority under 35 U.S.C. §119(e) to U.S. Provisional Application Serial No. 60/270,424, filed Feb. 21, 2001.

TECHNICAL FIELD

The present invention generally relates to making a silicon-on-insulator (SOI) semiconductor wafer, and in particular to a method for gettering impurities into a surface layer of the SOI wafer and removing the surface layer.

BACKGROUND OF THE INVENTION

Recently, silicon-on-insulator (SOI) wafers increasingly have been used in very-large scale integration (VLSI) or ultra-large scale integration (ULSI) of semiconductor devices. An SOI wafer typically has a layer of silicon on top of a layer of an insulator material. In an SOI integrated circuit, essentially complete device isolation may be achieved using conventional device processing methods by surrounding each device, including the bottom of the device, with an insulator. One advantage which SOI wafers have over bulk silicon wafers is that the area required for isolation between devices on an SOI wafer is less than the area typically required for isolation on a bulk silicon wafer.

SOI offers other advantages over bulk silicon technologies as well. For example, SOI offers a simpler fabrication sequence compared to a bulk silicon wafer. Devices fabricated on an SOI wafer may also have better radiation resistance, less photo-induced current, and less cross-talk than devices fabricated on bulk silicon wafers. Devices within integrated circuits in SOI wafers are very sensitive to the presence of even minute concentrations of some impurities. For example, metals, such as copper, nickel, silver, gold, or iron, within the active region of a device typically degrade several device characteristics, including leakage current and oxide breakdown voltage. These and other metals rapidly diffuse through silicon at temperatures typical of semiconductor device fabrication processes. These impurities may come to reside in the active region of the SOI wafer, as a result of various steps in the wafer fabrication process and their inability to diffuse through the insulation region. Accordingly, SOI wafers are more prone to device and reliability problems caused by the presence of impurities that remain in the active region.

Methods of gettering a silicon substrate are well known. Gettering is used to remove contaminants (usually heavy metals) from regions of the circuit where their presence would degrade device performance. Most all the transition metals, such as gold, copper, iron, titanium, nickel, etc., have been reported as possible contaminants. It is desirable to reduce the presence of such contaminants in the active regions in order to reduce, for example, reverse junction leakage, improve bipolar transistor gain, and increase refresh time in dynamic metal oxide semiconductor (MOS) memories. There are two common forms of gettering: intrinsic gettering and extrinsic gettering.

Intrinsic gettering involves forming gettering sites in the bulk of a semiconductor substrate, generally below the active regions near the frontside surface of the semiconductor substrate. In silicon substrates (wafers) manufactured using the Czochralski (Cz) method, intrinsic gettering generally includes an initial denuding step (for wafers without silicon epitaxial layers) followed by a nucleation step, and then a precipitation step. Denudation, nucleation, and precipitation, in combination, form lattice dislocations in the silicon bulk below the active regions. The dislocations serve to trap heavy metal ions at the dislocation sites, away from the overlying active regions.

Intrinsic gettering has been applied to standard semiconductor wafers for many years. However, due to the comparatively thin device or active layer of SOI wafers, intrinsic gettering cannot easily be applied to such wafers without unduly increasing the thickness of the device or active layer, which would defeat the purpose of the SOI wafer, i.e., to have a relatively thin monocrystalline silicon device or active layer. Thus, SOI wafers do not lend themselves to intrinsic gettering.

Extrinsic gettering, on the other hand, generally involves gettering near the backside surface of a silicon substrate. There are several methods used to perform extrinsic gettering. Two common methods include (i) diffusing phosphorous into the backside surface of a silicon wafer, and/or (ii) depositing polycrystalline silicon (polysilicon) on the backside surface of a silicon wafer. Diffusion processes utilizing extrinsic gettering techniques such as backside phosphorous diffusion and polysilicon deposition is described in Runyan, et al., Semiconductor Integrated Circuit Processing Technology, (Addison-Wesley Publishing Co., 1990), pp.428–442; and, DeBusk, et al., "Practical Gettering in High Temperature Processing", Semiconductor International, (May 1992) (both of which are herein incorporated by reference for their teachings relating to gettering).

Extrinsic gettering has been applied to the frontside surface of polycrystalline silicon wafers, in which phosphorus doping of contact layers is used to obtain frontside (or topside) gettering of diffused impurities or contaminants.

In SOI wafer technology, however, the use of polysilicon in direct contact with the back of the SOI wafer is not an effective gettering scheme, since the buried oxide layer will act as a diffusion barrier, causing contaminants to become trapped in the SOI film. The use of topside gettering by phosphorus doping of contact layers has not been effective in SOI technology due to the fact that it has been applied late in the fabrication process and thus cannot prevent contamination during earlier stages of the process. Being applied late in the fabrication process, it can only provide gettering sites at accessible portions of the top surface of the circuit, leaving contaminants in other portions covered by device elements and from which the impurities cannot directly be gettered, which impurities may migrate from the other portions and thereby become troublesome.

The aforementioned problems resulting from both the nature of the SOI wafer and from the deficiencies in prior art gettering methods remain. The combination of these factors has presented a significant problem in gettering impurities from the active regions of SOI semiconductor devices at the beginning or early stages of the fabrication process. Thus, a gettering method applicable to SOI wafers in an early stage of the production of such wafers has been sought.

SUMMARY OF THE INVENTION

A method of extrinsic gettering of the surfaces of SOI wafers is the subject of this application. In one embodiment, the method is applied to the frontside, i.e., the surface of the silicon film which forms the device or active layer, of the SOI wafer. In one embodiment, the method is applied to both the frontside and the backside surfaces of the SOI wafer.

In one embodiment, the present invention relates to a method of manufacturing a silicon-on-insulator substrate, comprising the steps of:
- providing a silicon-on-insulator semiconductor wafer having a device layer surface of a silicon film;
- implanting an inert atom into the at least one surface to form a damaged surface layer including a gettering site on the silicon film and to leave an undamaged region of the silicon film;
- subjecting the wafer to conditions to getter at least one impurity from the silicon film into the gettering site; and
- removing the damaged surface layer.

In one embodiment, the silicon film is a monocrystalline silicon film.

In one embodiment, the inert atom is one or more of helium, argon, krypton, xenon, silicon or germanium.

In one embodiment, the damaged surface layer is removed by etching with an etchant or by chemical mechanical polishing. In one embodiment, the damaged surface layer is removed by an etchant comprising hydrogen fluoride. In one embodiment, a portion of the undamaged region of the silicon film is removed by chemical mechanical polishing.

In one embodiment, the step of removing the damaged surface layer includes removing a portion of the undamaged region of the silicon film. In one embodiment, the silicon film has an initial thickness in excess of a predetermined final thickness. In one embodiment, the removal of the damaged surface layer and the portion of the undamaged silicon film leaves the predetermined final thickness of the silicon film.

In one embodiment, the method results in reduction of a concentration of at least one impurity in the silicon film.

In one embodiment, the present invention relates to a method of manufacturing a silicon-on-insulator substrate, comprising the steps of:
- providing a silicon-on-insulator semiconductor wafer having at least one surface of a silicon film, wherein the silicon film has an initial thickness in excess of a predetermined final thickness;
- implanting an inert atom into the at least one surface to form a damaged surface layer including a gettering site on the silicon film and to leave an undamaged region of the silicon film;
- subjecting the wafer to conditions to getter the at least one impurity from the silicon film into the gettering site; and
- removing the damaged surface layer and an undamaged portion of the silicon film, leaving the predetermined final thickness of the silicon film.

In one embodiment, the present invention relates to a method of manufacturing a silicon-on-insulator substrate, comprising the steps of:
- providing a silicon-on-insulator semiconductor wafer having at least one surface of a monocrystalline silicon film, wherein the monocrystalline silicon film has an initial thickness in excess of a predetermined final thickness, and the monocrystalline silicon film contains an initial concentration of at least one impurity;
- implanting an inert atom into the at least one surface to form a damaged surface layer including a gettering site on the monocrystalline silicon film and to leave an undamaged region of the monocrystalline silicon film;
- subjecting the wafer to conditions to getter the at least one impurity from the monocrystalline silicon film into the gettering site; and
- removing the damaged surface layer and a portion of the undamaged region of the monocrystalline silicon film, leaving the predetermined final thickness of the monocrystalline silicon film, wherein the predetermined final thickness of the monocrystalline film contains a concentration of the at least one impurity substantially lower than the initial concentration.

Thus, the present invention provides a method for gettering an SOI wafer which addresses and overcomes the limitations of the prior art.

DETAILED DESCRIPTION

As used herein, the term "impurity" refers to atoms or molecules which are not intended to be present in the particular semiconductor material. As used herein, an impurity does not include atoms or molecules which have been intentionally added to a semiconductor material and are intended to have a function in the semiconductor material, for example, as a dopant. Impurities, as used herein, are generally substances the presence of which may result in deleterious or unwanted effects in the performance of the semiconductor device in which such impurity may reside.

The method of the present invention may be applied to a silicon-on-insulator (SOI) semiconductor wafer at any time subsequent to the formation of the SOI wafer. In one embodiment, the method is applied immediately following initial fabrication of the SOI wafer. In one embodiment, the method is applied to the SOI wafer following one or more of leveling, polishing, annealing, recrystallizing or any other process performed upon the SOI wafer prior to fabrication of elements on the surface which prevent carrying out the presently disclosed method.

In the first step of the method of the present invention, a silicon-on-insulator (SOI) semiconductor wafer having at least one surface of a silicon film is provided. In one embodiment, the silicon film is a monocrystalline silicon film. As used herein, the term "monocrystalline" means a crystal lattice structure substantially without defects in the crystal structure and containing few impurities. The SOI wafer may be formed by any technique for forming such wafers, as described more fully below.

Figure 1:
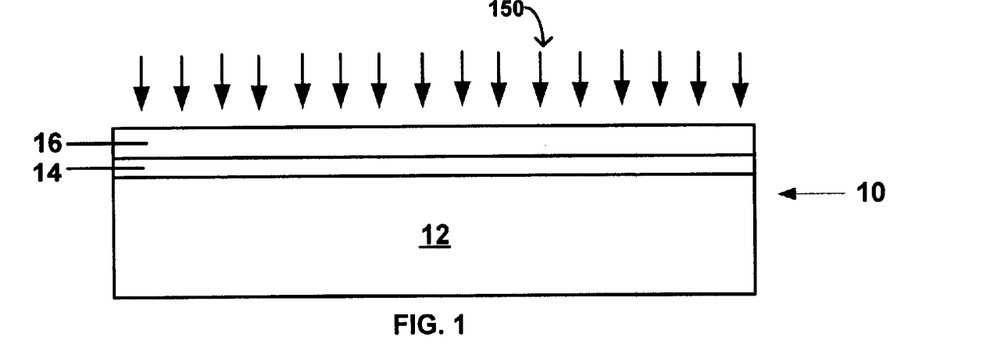
FIG. 1 is a partial cross-sectional view of an SOI wafer.

FIG. 1 shows a partial cross-sectional view of an SOI wafer 10, with a silicon substrate 12, a buried oxide layer 14 and a silicon film 16. The silicon film 16 contains at least one impurity. The impurity may comprise, e.g., metal atoms, as more fully described below. The impurity, which may be distributed throughout the monocrystalline silicon film 16, and is present at an initial concentration, is not shown in FIG. 1.

The SOI wafer 10 may be formed by any method known in the art. In one embodiment the SOI wafer 10 is formed by wafer bonding. In one embodiment, the SOI wafer is a silicon-on-sapphire (SOS) wafer. In one embodiment, the SOI wafer is made by a zone-melting-and-recrystallization (ZMR) method. In one embodiment, the SOI wafer is made by a "smart-cut" method. The present invention, as described herein, is applied to an already-formed SOI wafer, and thus is not limited to any particular method of forming the SOI wafer. More detailed descriptions of the foregoing methods of formation of SOI wafers may be found, for example, in Kuo, James B. and Ker-Wei Su, "CMOS VLSI Engineering Silicon-on-Insulator (SOI)", Kluwer Academic Publishers, 1998. This publication is incorporated herein by reference for its teachings of methods of formation of SOI wafers.

The SOI wafer 10 may be formed by any method known in the art. In one embodiment the SOI wafer 10 is formed by wafer bonding. In a wafer bonding process, oxide layers are grown on a surface of each of two silicon wafers. The oxide layers should be as clean and smooth as possible. In one embodiment, at least one of the silicon wafers is a monocrystalline silicon wafer. One of the monocrystalline silicon wafers has a zone of weakness in a plane parallel to the surface upon which the oxide was grown. The zone of weakness may be created by any method known in the art, for example, by a process of implantation of, e.g., hydrogen which may form a layer of hydrogen gas bubbles, in a process known as "Smart-Cut". Other known methods of forming the zone of weakness may be employed, such as implantation of species other than hydrogen. The clean and smooth oxide layers of the two silicon wafers are placed together. Heat and pressure are applied to form a bond between the oxide layers, thus forming a single oxide layer buried between the silicon layers, which forms the buried oxide layer of the nascent SOI wafer.

The zone of weakness is broken, by application of heat or mechanical pressure, whereupon the bulk of the silicon wafer having the zone of weakness is removed, leaving a relatively thin silicon film from which the silicon active layer will be formed. The nascent SOI wafer may then be annealed, which results in full fusion of the oxide layers and removes crystalline defects from the monocrystalline silicon film. In one embodiment, the foregoing process is used to form the SOI wafer 10.

In one embodiment, the SOI wafer may be formed by creating a buried oxide layer by implantation of oxygen into a single silicon wafer. This process is known as SIMOX (separation by implanted oxygen). The oxygen may be implanted into one surface of a monocrystalline silicon wafer by any standard technique, to a depth necessary to leave a thin silicon film on the surface. As a result of implantation of the oxygen, the silicon film may have been damaged. Thus, in one embodiment, the nascent SOI wafer is annealed to remove defects from the resulting monocrystalline silicon film 16. In one embodiment, the foregoing process is used to form the SOI wafer 10.

The SOI wafer 10 used in the present invention may be any SOI wafer formed by any of the above-mentioned techniques for forming SOI wafers, or by any other method of forming SOI wafers. The present invention, as described herein, is applied to a previously formed SOI wafer, and thus is not limited to any particular method of forming the SOI wafer. More detailed descriptions of the foregoing methods of formation of SOI wafers may be found, for example, in Kuo, James B. and Ker-Wei Su, "CMOS VLSI Engineering Silicon-on-Insulator (SOI)", Kluwer Academic Publishers, 1998. This publication is incorporated herein by reference for its teachings of methods of formation of SOI wafers.

In the second step of the method of the present invention, inert atoms are implanted into the semiconductor element. The inert atoms are implanted by applying the inert atoms at an energy and at a dose sufficient to form a damaged surface layer in the entire surface of the SOI semiconductor wafer at or just below the surface thereof. In FIG. 1, the inert atoms are shown schematically by arrows 150 being directed at the entire surface of the SOI wafer 10. In one embodiment, no device structures are present on the surface of the SOI wafer at the time when the inert atoms are implanted. In one embodiment, no device structures are present in the device layer of the SOI wafer at the time when the inert atoms are implanted. The presence of such structures may act as a mask and prevent implantation of inert atoms in the silicon film 16 underlying such structures. The damaged surface layer 18 (shown in FIG. 2) formed by the step of implanting inert atoms includes defects and dislocations which constitute gettering sites.

The inert atom used in the method of the present invention may be one or more of helium, neon, argon, krypton, xenon, silicon and germanium. While neither silicon nor germanium are normally considered as an "inert atom", they are included in the group of inert atoms in the present invention because both silicon and germanium are non-reactive to and do not dope, i.e., are inert to, the silicon film 16 into which they are implanted. Thus, any atom which neither reacts with nor dopes silicon possibly may be used as the inert atom in the present invention. In other embodiments, the silicon film 16 previously may have been doped, i.e., may be an n-type silicon or a p-type silicon. In one such embodiment, the silicon film 16 may comprise portions of both n-type silicon and p-type silicon. In these other embodiments, the inert atom substantially should not alter the doped character of the silicon.

Figure 2:
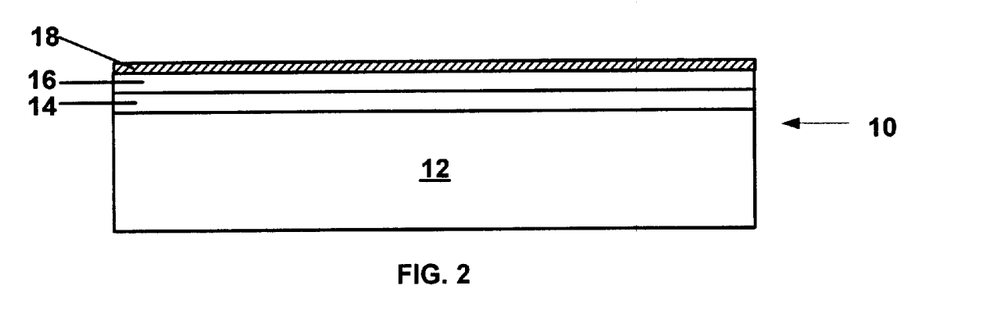
FIG. 2 is a partial cross-sectional view of an SOI wafer following implantation of an inert atom in accordance with the present invention.

The energy of implantation controls the depth to which the inert atoms will be implanted into the substrate, and thereby the thickness of the damaged surface layer 18. Higher atomic weight inert atoms require higher energies in order to be deposited to the same depth as lower atomic weight inert atoms. The energy of implantation of the inert atoms is selected so that the inert atoms are implanted to a relatively shallow depth in the silicon film 16. The implantation of inert atoms into the monocrystalline silicon film 16 introduces defects into the substrate from a point at or very near the surface of the monocrystalline silicon film 16 bombarded with the inert atoms to a depth of implantation as needed to provide a sufficient number of gettering sites, e.g., to a depth of about 100 Å. In one embodiment, the inert atom is implanted at an energy sufficient to form the damaged surface layer 18 to a depth in the range of about zero (i.e., essentially at the surface) to about 200 Å. In one embodiment, the inert atom is implanted at an energy sufficient to form the damaged surface layer 18 to a depth in the range of about 0.1 Å to about 100 Å. In one embodiment, the inert atom is implanted at an energy sufficient to form the damaged surface layer 18 to a depth in the range of about 0.5 Å to about 50 Å. Implanting the inert atoms, and forming the damaged layer only at a selected surface layer is advantageous since the impurities gettered into the damaged surface layer 18 may be gettered into a relatively thin damaged layer 18 in the layer of silicon film 16, thereby leaving only a relatively thin layer of material to be removed following the subsequent gettering steps. Such a relatively thin layer may be in the range from about 0.1 Å to about 100 Å. Here and elsewhere in the specification and claims, the numerical limits of ranges and ratios may be combined.

The energy of implantation generally ranges from about 0.1 to about 200 KeV for implantation into a silicon film 16 to form a damaged surface layer 18 having a thickness in the range from about 0.1 Å to about 200 Å. The exact energy depends, inter alia, on the identity of the inert atom, the nature, thickness and crystallinity of the silicon film target layer, the depth to which the inert atom is to be implanted, and the degree of damage sought. When the inert atom is a light element such as helium, the implantation energy may be relatively low, while still obtaining a desired depth of implantation. Conversely, a heavy element such as xenon requires a significantly higher energy to obtain the same desired depth of implantation in the same target. Persons of skill in the art can easily determine the implantation energy based on the desired depth of implantation, the particular inert atom to be implanted, and the degree of damage sought. In any case, the energy of implantation should be such that the degree of damage is below that which would render the silicon target amorphous.

The dose of the inert atom should be sufficient to obtain the degree of damage desired. The dose required is approximately inversely proportional to the mass of the inert atom being implanted. Thus, for example, when helium is employed as the inert atom, a dose about 100 times higher is required to obtain the same degree of damage obtained from xenon.

The dose and identity of inert atom, and the energy of implantation, may be selected according to the degree and depth of damage desired, the materials involved and related factors. Those of skill in the art can determine the appropriate doses and energies based on well known information and/or by running well known simulation programs using selected atoms. In general, higher doses result in denser concentrations of the atoms, greater damage, and therefore a higher density of gettering sites in the damaged surface layer 18. Higher doses may require more passes with the implanting apparatus to complete implantation to the desired dose, compared to lower doses, and so would be more expensive to make. However, the increased expense may be offset by the increased gettering efficiency resulting from higher density defects. In one embodiment, higher doses at lower energy provide a highly damaged, i.e., heavily implanted but relatively thin, damaged surface layer 18. As mentioned above, the present invention permits the implantation of high doses in order to achieve a high level of damage for gettering.

The implanted inert atoms result in the formation of the damaged surface layer 18 in the crystal lattice of the silicon film 16. The damaged surface layer 18 includes crystal defects, dislocations and gaps or holes in the crystal lattice of the upper surface layer of the silicon film 16. These crystal defects, dislocations, gaps or holes constitute gettering sites.

In one embodiment, the temperature of the silicon film 16 is controlled between about 20° C. and about 300° C. during the implantation. The pressure in the chamber is maintained between about $10^{-9}$ torr and about $10^{-5}$ torr (about $10^{-7}$ Pa to about $10^{-3}$ Pa). As a result, the damaged surface layer 18 is formed on the upper surface layer of the silicon film 16.

The inert atoms may be implanted by any implantation device known in the semiconductor art. The present invention is not limited to any particular form of implantation, nor to any particular implantation device. Such devices are well known to those of skill in the art.

FIG. 2 shows a partial cross-sectional view of the SOI wafer 10 following the implantation of an inert atom or atoms to form a damaged surface layer 18 in the upper surface of the silicon film 16. The damaged surface layer 18 contains at least one gettering site. In one embodiment, the damaged surface layer 18 contains a plurality of gettering sites. In one embodiment, the damaged surface layer 18 constitutes a gettering layer. The gettering layer contains gettering sites, i.e., dislocations or defects, which constitute sites at which the impurities may be gettered together in the subsequent gettering step. In general, formation of the damaged surface layer 18 results in formation of at least one gettering site. The gettering sites are not separately shown in the damaged surface layer 18 in FIG. 2. Rather, the damage is represented schematically by the hash marks in the damaged surface layer 18.

In the third step of the method of the present invention, the SOI wafer 10 including the damaged surface layer 18 is subjected to gettering conditions in order to getter impurities from the silicon film 16 into the gettering sites contained in the damaged surface layer 18. In the gettering step of the present invention the SOI wafer 10 with the damaged surface layer 18 is subjected to temperatures in the range from about 600° C. to about 1200° C. for periods of about 1 minute to about 500 minutes, in order to cause impurities, such as metal ions, in the thin silicon film to migrate into the damaged surface layer 18.

The gettering step of the present invention is conventional gettering, in which the SOI wafer 10 is subjected to temperatures in the range from about 600° C. to about 1200° C. for periods of about 1 to about 500 minutes, in order to cause impurities, such as metal ions, in the adjacent portions of the SOI semiconductor device to migrate into the gettering sites within the damaged surface layer 18. In one embodiment, the gettering step is carried out at a temperature of about 800° C. In one embodiment, the gettering step is carried out at a temperature of about 900° C. In one embodiment, the gettering step is carried out at a temperature of less than about 1100° C. In one embodiment, the gettering step is carried out at a temperature in the range from about 900° C. to about 1050° C.

The exact temperature at which gettering takes place depends upon the impurities which are to be gettered. Since gettering is a process of moving impurity atoms or ions through the crystal lattice of the silicon film, the rate at which the impurities move is a function of both the temperature and the diffusivity of the impurities in the silicon. Thus, the exact temperature at which gettering takes place depends upon the particular impurities which are desired to be gettered, as will be understood by those of skill in the art. Such persons can easily determine the exact conditions at which the desired gettering takes place.

In one embodiment, the gettering step is carried out in an inert atmosphere to ensure the purity of the silicon wafer is maintained. In one embodiment, the gettering step is carried out in nitrogen. In one embodiment, the gettering step is carried out in argon. In one embodiment, the gettering is carried out in air. In one embodiment, the gettering is carried out in an oxidizing atmosphere. In one embodiment, the gettering is carried out in a reducing atmosphere. In one embodiment, the gettering step is carried out at atmospheric pressure. In one embodiment, the gettering step is carried out at sub-atmospheric pressure.

The gettering step results in the migration of isolated impurity atoms or molecules into gettering sites in the damaged surface layer 18. In one embodiment, the gettering step results in the migration of isolated impurity atoms or molecules into nucleated gettering sites in the damaged surface layer 18. The gettering sites, as is known in the art, include, e.g., dislocations and other crystal defect sites existing in the damaged surface layer 18. As is known in the art, these sites may be nucleated into larger gettering sites prior to or during the step of subjecting the SOI wafer to conditions to getter the at least one impurity from the silicon film into the gettering sites.

Figure 3:
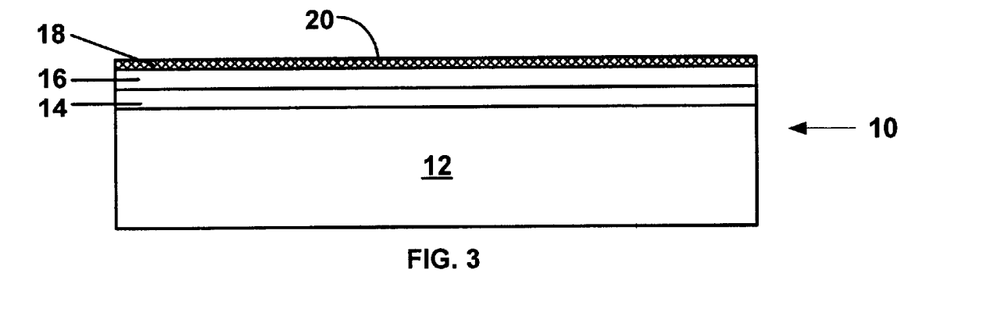
FIG. 3 is a partial cross-sectional view of an SOI wafer following a step of subjecting an SOI wafer to gettering conditions in accordance with the present invention.

FIG. 3 shows a partial cross-sectional view of the SOI wafer 10 following a gettering step, in which impurities 20 have diffused from the silicon film 16 into the damaged surface layer 18. Thus, as a result of the gettering, the impurities 20 which previously existed in the silicon film 16 have been gettered into the damaged surface layer 18. In FIG. 3 the impurities 20 are shown schematically by the cross-hatched damaged surface layer 18 which represents the gettered impurity atoms or molecules 20 which have gathered (or, gettered) together at the sites indicated in the damaged surface layer 18.

In one embodiment, the second and third steps occur substantially simultaneously. In one embodiment, the second and third steps occur during the same processing step. That is, the step of implanting inert atoms to form the damaged surface layer 18 on the at least one surface to form a gettering site, and the step of subjecting the SOI wafer 10 to conditions to getter at least one impurity from the silicon film into the gettering site, occur together, under the same conditions and in the same apparatus. The term "substantially simultaneously" means that the step of forming a gettering site by implanting an inert atom is not intentionally or detectably separate from the step of subjecting the wafer to gettering conditions. The phrase "during the same processing step" means that the conditions under which the damaged surface layer is formed by implanting an inert atom are essentially the same conditions to getter the at least one impurity from the silicon film into the gettering site, and that carrying out the second step results in carrying out the third step. In this context, it may be understood that a gettering site must exist before an impurity may be captured by the gettering site. However, the migration of the impurities, which eventually results in the impurity "finding" and being "captured by" a gettering site, may be considered to co-occur with the formation of the gettering sites. In one embodiment, when the damaged surface layer 18 is formed by the implantation of an inert atom at a temperature of about 700° C. to about 1100° C., gettering takes place substantially simultaneously, or during the same processing step.

In one embodiment, the second step and the third step occur sequentially. In an embodiment in which the step of formation of the damaged surface layer 18 occurs at a temperature lower than a temperature which results in gettering, the third step is performed by subsequently raising the temperature to a temperature at which gettering takes place. Thus, in this embodiment, the third step may be undertaken at a later time and/or in a separate apparatus from the second step. In one embodiment, when the damaged surface layer 18 is formed by a low temperature method at a temperature which is lower than the temperature needed for gettering to take place, the third step is a separate step from the second step. In this embodiment, the third step comprises increasing the temperature of the silicon film 16 and the damaged surface layer 18 to a temperature at which gettering takes place, following the step of implanting the inert atoms to form the gettering sites in the damaged surface layer 18.

In one embodiment, the concentration of the impurities which are to be gettered range from about $1 \times 10^{11}/cm^3$ to about $1 \times 10^{18}/cm^3$. In one embodiment, the concentration of the impurities which are to be gettered range from about $1 \times 10^{13}/cm^3$ to about $1 \times 10^{17}/cm^3$. In one embodiment, the concentration of the impurities which are to be gettered range from about $1 \times 10^{15}/cm^3$ to about $1 \times 10^{16}/cm^3$ or higher. The level of impurities prior to gettering depends on, e.g., the cleanliness of the process by which the SOI wafer 10 is produced.

Following the gettering, the concentration of the impurities in the regions of the silicon film 16 adjacent the damaged surface layer 18 should be reduced close to a level at which they are not detectable. In one embodiment, the concentration of the at least one impurity is not detectable in the silicon film 16 following the gettering step. In one embodiment, the concentration of the at least one impurity in the silicon film 16 is reduced to about $1 \times 10^{8}/cm^3$ to about $1 \times 10^{10}/cm^3$ by the gettering step. As will be understood by those of skill in the art, the lower limit of detection of a given impurity depends on the sensitivity of available analytical techniques applicable to that impurity, and this level varies for different impurities. Of course, the lower limit of detection may be reduced by subsequent improvements in analytical techniques. In addition, as will be understood by those of skill in the art, the degree of reduction of the concentration of a given impurity depends on the relative solubility and diffusivity of that impurity in the silicon film 16.

Figure 4:
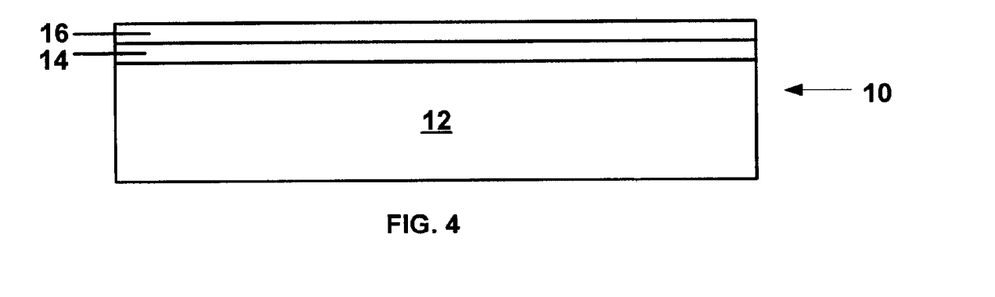
FIG. 4 is a partial cross-sectional view of an SOI wafer following a step of removing the damaged surface layer, in accordance with the present invention.

In the fourth step of the method of the present invention, the damaged surface layer 18 is removed. In one embodiment, in addition to the damaged layer 18, a portion of the silicon film 16 also is removed, but still leaves a substantial portion of the silicon film 16. In one embodiment, the removal of the damaged surface layer 18 is performed in a separate step from the removal of a portion of the silicon film 16. In one embodiment, the same step removes both the damaged surface layer 18 and a portion of the underlying undamaged region of the silicon film 16.

In one embodiment, the damaged surface layer 18 is removed by etching with an etchant. In one embodiment, the damaged surface layer 18 is removed by chemical mechanical polishing. In one embodiment, the damaged surface layer 18 is removed by an etchant which comprises fluorine. In one embodiment, the damaged surface layer 18 is removed by an etchant which comprises hydrogen fluoride. In one embodiment, an aqueous solution comprising HF is used as the etchant. In one embodiment the aqueous solution of HF is prepared by dissolving from about 0.1 part to about 10 parts HF in about 30 parts of water.

In one embodiment, the damaged surface layer 18 is removed by another known method, such as chemical mechanical polishing (CMP). In one embodiment, the CMP is employed to remove sequentially, simultaneously or in a continuous process, both the damaged surface layer 18 and a portion of the underlying silicon film, as described more fully below. Thus, in one embodiment, CMP is employed to remove first the damaged surface layer 18 and then a portion of the silicon film 16, in one continuous CMP process. In one embodiment, CMP is used only for removing a portion of the undamaged region of the silicon film 16, following a step of removing the damaged surface layer 18 by another method such as the above-described etching. CMP is more fully described below.

FIG. 4 shows a partial cross-sectional view of the SOI wafer 10 following an etching and/or polishing step, in which the damaged surface layer 18, with the gettered impurities 20 contained therein, has been removed. In one embodiment, the removing step removes primarily only the damaged surface layer 18, along with the gettered impurities 20, but does not remove any of the silicon film 16. In one embodiment, described in more detail below, a small portion of the silicon film 16 is removed in addition to the damaged surface layer 18. As a result of the removing step, the gettered impurities 20 contained in the damaged surface layer 18, have been removed from the SOI wafer 10 together with the damaged surface layer 18.

In one embodiment, a portion of the silicon film 16 is removed by etching or polishing in addition to the damaged surface layer 18. In one embodiment, the polishing is chemical mechanical polishing (CMP). In one embodiment, the CMP follows an etching step, in which the damaged surface layer 18 is etched away, and then a small portion of the undamaged silicon film 16 is removed by polishing. In one embodiment, mentioned above, the CMP is used to remove a portion of the silicon film 16 following removal of the damaged surface layer 18 also by CMP, in other words, CMP is used to remove both the damaged surface layer 18 and the small portion of the undamaged silicon film 16. While the damaged surface layer 18 and the portion of the undamaged silicon film 16 are separate and so will be removed sequentially, in one embodiment, the two layers are removed together, essentially simultaneously, in one continuous operation.

The CMP step is carried out by any CMP method known in the art. In general, CMP involves rotation of a wafer on a rotary platen in the presence of a polishing medium and a polishing pad that grinds (chips away) the surface material. In one embodiment, the polishing pad is mounted on a rotary platen which is counter-rotated with the rotary platen containing the wafer. In one embodiment, the polishing pad is in the form of a belt applied to the rotary platen upon which the wafer is mounted. The CMP process is actually considered to comprise two steps: step one consists of chemically modifying the surface of the material and then in the final step the altered material is removed by mechanical grinding. Other known CMP processes may be used, so long as the amount removed remains controllable and the resulting surface is smooth and flat. The CMP process should control the chemical attack of the substrate and the rate of the grinding, and should selectively remove only the desired layers of the wafer features without significant damage to the wafer features which are to be retained.

The polishing slurries used in CMP comprise an abrasive suspension (silica, alumina, etc.) usually in an aqueous medium. The aqueous medium may include a dispersion and/or a solution, including other chemical species. The type and size of the abrasive, the solution pH and presence of (or lack of) oxidants or other chemical agents are very important to the CMP process. In order to remove a portion of a silicon film by CMP, the pH of the aqueous medium should be relatively high, in the range from about 9.0 to about 14.0. In one embodiment, the pH of the aqueous medium used in CMP of the portion of the silicon film is in the range from about 10.0 to about 12.0.

In one embodiment, a sufficient amount of the portion of the silicon film 16 which has not been damaged is removed to provide a reasonable margin of certainty that all of the damaged surface layer 18 of the silicon film 16 which includes gettered impurities 20 has been removed from the SOI wafer. In one embodiment, the silicon film 16 remaining after the removing step includes no detectable damage and no detectable implanted inert atoms. The portion of the silicon film which must be removed in order to remove all of the damaged surface layer 18 may be determined in advance, since the implantation of inert atoms into silicon is consistently repeatable.

In one embodiment, the portion removed is the damaged surface layer 18 plus a small amount of the monocrystalline silicon film 16, such as from about 1% to about 5% of the remaining undoped thickness of the silicon film 16. In this embodiment, the small portion of the silicon film which has not been damaged by implantation of inert atoms is removed in order to provide assurance that substantially all of the damaged surface layer 18 with its complement of gettered impurities 20 has been removed from the surface of the silicon film 16. "Substantially all" of the damaged surface layer 18 with its complement of gettered impurities 20 means that in the remaining silicon film 16, the levels of implanted inert atoms and defect sites are reduced to less than about 1% of the level at which the silicon film 16 originally contained these inert atoms following the implantation step.

The "small portion" of the silicon film which has not been damaged which is removed in one embodiment, includes a sufficient amount of the silicon film to provide an acceptable margin of certainty that substantially all of the silicon film which includes implanted inert atoms or is damaged has been removed from the SOI wafer 10. As mentioned above, this amount may be, for example, about 1% to about 5% of the remaining thickness of the monocrystalline silicon film 16. The actual thickness of the damaged surface layer 18 and/or the small portion of the undoped silicon film 16 which need to be removed will vary, e.g., with the length of the gettering step and with the uniformity of the polishing equipment, as well as with the levels of inert atoms and defects which are acceptable.

As can be easily understood, in order to remove the portions of the silicon film 16 containing the damaged surface layer 18, while leaving a desired, predetermined final thickness, the silicon film 16 must be initially formed in a thickness which is greater than the predetermined final thickness by an amount equal to the thickness of the layer to be removed, i.e., the damaged surface layer 18 and any additional amount of the silicon film 16 also to be removed. Thus, in one embodiment, the silicon film has an initial thickness in excess of a predetermined final thickness. In one embodiment, removal of the portion of the silicon film 16 including the damaged surface layer 18 and any additional portion of the silicon film 16 leaves a predetermined final thickness of the silicon film 16. The final thickness of the silicon film 16 may be predetermined based on various considerations known in the art.

The thicknesses of the layers may be as follows. As will be understood by those of skill in the art, thicknesses, along with semiconductor dimensions generally, continue to be reduced. Thus, the following thickness ranges are relative, since size reductions are expected to continue. In one embodiment, the overall thickness of the SOI wafer following application of the method of the present invention is according to the SEMI specification. In one embodiment, the thickness of the SOI wafer following application of the method of the present invention is about 725 microns for an 8 inch wafer.

The thickness of the monocrystalline silicon film is not limiting to the present invention. In one embodiment, the final thickness of the monocrystalline silicon film (device or active layer) is in a range from about 100 to about 1000 Å, following application of the method of the present invention. In one embodiment, the final thickness of the monocrystalline silicon film is in a range from about 200 to about 800 Å. In one embodiment, the final thickness of the monocrystalline silicon film is in a range from about 400 to about 600 Å. This thickness is referred to herein as the predetermined final thickness.

In one embodiment, the initial thickness of the monocrystalline silicon film of the SOI wafer prior to application of the method of the present invention is from about 500 Å to about 1000 Å thicker than the predetermined final thickness. Thus, the initial thickness of the monocrystalline silicon film may range from about 600 Å to about 2500 Å in thickness. The thickness of the monocrystalline silicon film removed corresponds generally to the depth of doping of inert atoms into the monocrystalline silicon film. In one embodiment, the additional undoped monocrystalline silicon film which is removed has a thickness from about 10 to about 100 Å.

In one embodiment, the thickness of the buried oxide (BOX) layer ranges from about 200 to about 4000 Å. In one embodiment, the thickness of the buried oxide layer ranges from about 500 to about 2000 Å. In one embodiment, the thickness of the buried oxide layer ranges from about 800 to about 1500 Å.

The silicon substrate 12 constitutes the remainder of the thickness of the SOI wafer.

Following the foregoing treatment steps, the SOI wafer 10 may be annealed in order to recrystallize any remaining damaged portions of the silicon film 16 into a monocrystalline silicon film. Thereafter, the SOI wafer may be further processed by methods known in the art to prepare the desired semiconductor device comprising an SOI wafer.

Figure 5:
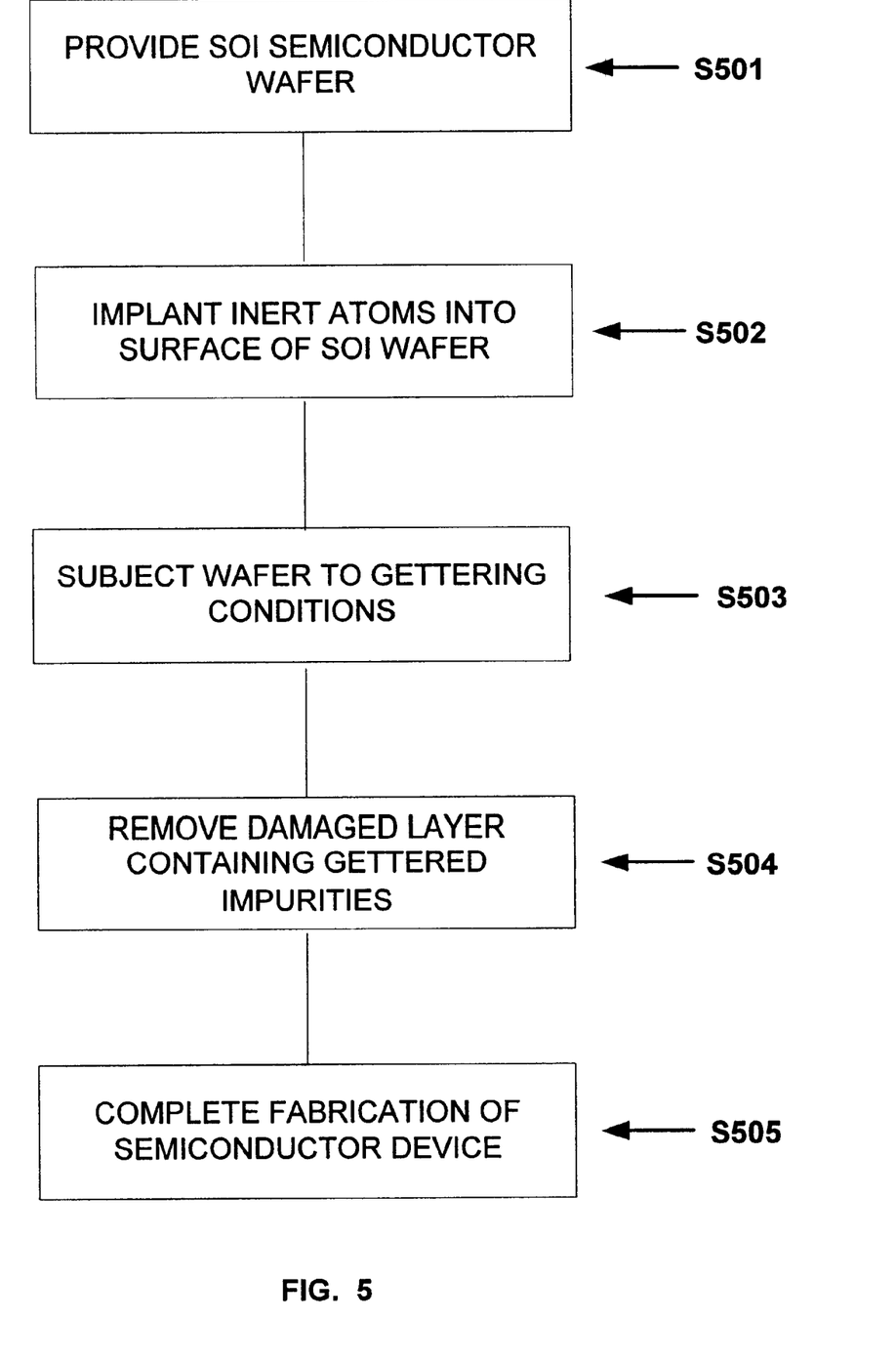
FIG. 5 is a flowchart illustrating the process steps of the present invention.

FIG. 5 is a flowchart illustrating the fundamental process steps of the present invention. As shown in FIG. 5, the method of manufacturing a semiconductor device according to the present invention includes a first step, S501, in which an SOI semiconductor wafer having a silicon film formed on an insulation layer is provided. The SOI semiconductor wafer may be formed by any method for forming such an SOI wafer.

As shown in FIG. 6, in the method of the present invention, a second step S502 includes implanting inert atoms into a surface layer of the silicon film of the SOI wafer, to form a damaged surface layer. The implantation may be by any means known to those of skill in the art. The implantation of step S502 is carried out by exposing the surface of silicon film of the SOI wafer to inert atoms emitted from a suitable device at a selected dose and energy. The implantation is carried out by implanting the inert atoms at an energy and at a dose sufficient to form a damaged layer on the surface of the silicon film. The damaged layer formed in step S502 includes gettering sites, into which impurities will be gettered subsequently. In one embodiment, during the implantation no semiconductor device or device element which would act as a mask to block implantation of inert atoms into the SOI wafer is present on the surface or in the device layer of the SOI wafer. The inert atoms implanted in the step S502 may be one or more of helium, neon, argon, krypton, xenon, silicon and germanium. The damaged layer formed in step S502 may be generally along the surface of the silicon film. In one embodiment, the damaged layer is formed substantially in a layer extending from the surface to a predetermined, selected depth below the surface. In one embodiment, the damaged surface layer is formed just below the surface of the silicon film.

As shown in FIG. 6, in the method of the present invention, a third step S503 includes subjecting the silicon film, or the SOI wafer as a whole, to conditions under which at least one impurity is gettered into the gettering sites in the damaged layer formed in the step S502. In one embodiment, the silicon film only may be exposed or subjected to gettering conditions. However, given the thickness of SOI wafers, it is more likely that the entire SOI wafer will be subjected to the gettering conditions, even though the gettering of interest in the present invention takes place only in the silicon film or device layer of the SOI wafer. The impurities are gettered into the gettering sites from portions of the silicon film adjacent the damaged layer. The impurities which may be gettered include metals.

As shown in FIG. 6, in the method of the present invention, a fourth step S504 includes removing the damaged layer containing gettered impurities from the silicon film of the SOI wafer. Removing the damaged layer may be accomplished by etching, chemical mechanical polishing, or other known methods for selectively removing a layer from a silicon substrate such as the SOI wafer. In addition to the damaged layer, in one embodiment, a small portion of the underlying undamaged silicon film may also be removed as a precautionary measure to make certain substantially all gettered impurities have been removed. In one embodiment, the small portion of the undamaged silicon film may be removed by etching or by chemical mechanical polishing. In one embodiment, the small portion of the undamaged silicon film is removed in one continuous operation along with the damaged layer.

The foregoing steps, summarized as steps S501–S504 shown in FIG. 6 and described in more detail above and in the specification as a whole, constitute the basic steps of the method of the present invention. Thereafter, as shown in FIG. 6, in step S505, further processing of the semiconductor device to complete the fabrication process may be undertaken. The further processing in step S505 may include, for example, annealing the SOI wafer to recrystallize any remaining damaged portions of the remaining silicon film. The step S505 may include other process steps, such as the many steps involved in formation of semiconductor devices on SOI wafer substrates, as understood by those of skill in the art. The process steps which may be included in the step S505 are not essential to the present invention.

What has been described above are certain embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of manufacturing a silicon-on-insulator substrate, comprising the steps of:

providing a silicon-on-insulator semiconductor wafer having a device layer surface of a silicon film;

implanting an inert atom into the surface to form a damaged surface layer on the entire surface, the damaged surface layer including a gettering site on the silicon film and to leave an undamaged region of the silicon film;

subjecting the wafer to conditions to getter at least one impurity from the silicon film into the gettering site; and removing the damaged surface layer.

2. The method of claim 1, wherein the silicon film is a monocrystalline silicon film.

3. The method of claim 1, wherein the inert atom is one or more of helium, argon, krypton, xenon, silicon or germanium.

4. The method of claim 1, wherein the damaged surface layer is removed by etching with an etchant or by chemical mechanical polishing.

5. The method of claim 1, wherein a portion of the silicon film is removed by chemical mechanical polishing.

6. The method of claim 1, wherein the step of removing the damaged surface layer includes removing a portion of the undamaged region of the silicon film.

7. The method of claim 1, wherein the silicon film has an initial thickness in excess of a predetermined final thickness.

8. The method of claim 7, wherein removal of the damaged surface layer and the portion of the undamaged silicon film leaves the predetermined final thickness of the silicon film.

9. The method of claim 1, wherein the method results in reduction of a concentration of at least one impurity in the silicon film.

10. A method of manufacturing a silicon-on-insulator substrate, comprising the steps of:

provding a silicon-on-insulator semiconductor wafer having at least one surface of a silicon film, wherein the silicon film has an initial thickness in excess of a predetermined final thickness;

implanting an inert atom into the at least one surface to form a damaged surface layer on the entire surface, the damaged surface layer including a gettering site on the silicon film and to leave an undamaged region of the silicon film;

subjecting the wafer to conditions to getter the at least one impurity from the silicon film to the gettering site; and removing the damaged surface layer and a portion of the undamaged region of the silicon film, leaving the predetermined final thickness of the silicon film.

11. The method of claim 10, wherein the silicon film is a monocrystalline silicon film.

12. The method of claim 10, wherein the inert atom is one or more of helium, argon, krypton, xenon, silicon or germanium.

13. The method of claim 10, wherein the damaged surface layer is removed by etching with an etchant or by chemical mechanical polishing.

14. The method of claim 10, wherein the portion of the undamaged region is removed by chemical mechanical polishing.

15. The method of claim 10, wherein the method results in reduction of a concentration of at least one impurity the silicon film.

16. A method of manufacturing a silicon-on-insulator substrate, comprising the steps of:

providing a silicon-on-insulator semiconductor wafer having at least one surface of a monocrystalline silicon film, wherein the monocrystalline silicon film has an initial thickness in excess of a predetermined final thickness, and the monocrystalline silicon film contains an initial concentration of at least one impurity;

implanting an inert atom into the at least one surface to form a damaged surface layer on the entire surface, the damaged surface layer including a gettering site on the monocrystalline silicon film and to leave an undamaged region of the monocrystalline silicon film; and subjecting the wafer to conditions to getter the at least one impurity from the monocrystalline silicon film into the gettering site;

removing the damaged surface layer and a portion of the undamaged region of the monocrystalline silicon film, leaving the predetermined final thickness of the monocrystalline silicon film, wherein the predetermined final thickness of the monocrystalline film contains a concentration of the at least one impurity substantially lower than the initial concentration.

17. The method of claim 16, wherein the inert atom is one or more of helium, argon, krypton, xenon, silicon or germanium.

18. The method of claim 16, wherein the damaged surface layer is removed by etching with an etchant or by chemical mechanical polishing.

19. The method of claim 16, wherein the damaged surface layer is removed by etching with an etchant comprising hydrogen fluoride.

20. The method of claim 16, wherein the portion of the undamaged region of the monocrystalline silicon film is removed by chemical mechanical polishing.

* * * * *